(12) United States Patent
Kononchuk (10) Patent No.: US 7,615,466 B2
(45) Date of Patent: Nov. 10, 2009

(54) METHOD FOR PRODUCING A SEMICONDUCTOR-ON-INSULATOR STRUCTURE

(75) Inventor: Oleg Kononchuk, Grenoble (FR)

(73) Assignee: S.O.I.Tec Silicon on Insulator Technologies, Bernin (FR)

( * ) Notice: Subject to any disclaimer, the term of this patent is extended or adjusted under 35 U.S.C. 154(b) by 210 days.

(21) Appl. No.: 11/683,731

(22) Filed: Mar. 8, 2007

(65) Prior Publication Data

US 2008/0153257 A1  Jun. 26, 2008

Related U.S. Application Data

(63) Continuation of application No. PCT/IB2006/003957, filed on Dec. 26, 2006.

(51) Int. Cl.
H01L 21/30 (2006.01)
H01L 21/46 (2006.01)

(52) U.S. Cl. .................. 438/458; 438/459; 438/311; 257/E21.568; 257/E21.331

(58) Field of Classification Search ........... 438/458, 438/459, 311, 479, 517; 257/E21.054, E21.568, 257/E21.331, E21.561
See application file for complete search history.

(56) References Cited

U.S. PATENT DOCUMENTS

| | | | | |
|---|---|---|---|---|
| 5,561,303 A * | 10/1996 | Schrantz et al. | ............... | 257/77 |
| 5,936,261 A | 8/1999 | Ma et al. | ............... | 257/59 |
| 6,328,796 B1 | 12/2001 | Kub et al. | ............... | 117/94 |
| 7,531,430 B2 * | 5/2009 | Kononchuk | ............... | 438/459 |
| 2003/0064735 A1 | 4/2003 | Spain et al. | ............... | 455/456 |
| 2005/0118789 A1 | 6/2005 | Aga et al. | ............... | 438/459 |
| 2006/0051945 A1 | 3/2006 | Yokokawa et al. | ............ | 438/526 |
| 2006/0154442 A1 | 7/2006 | De Souza et al. | ............ | 438/455 |

FOREIGN PATENT DOCUMENTS

| | | |
|---|---|---|
| EP | 0 707 338 A2 | 4/1996 |
| JP | 2000-036445 | 2/2000 |
| JP | 2006-049725 | 2/2006 |

(Continued)

OTHER PUBLICATIONS

G. K. Celler et al., "Frontiers of Silicon-on-insulator", Journal of Applied Physics, vol. 93, No. 9, pp. 1-24 (2003).

(Continued)

Primary Examiner—Walter L Lindsay, Jr.
(74) Attorney, Agent, or Firm—Winston & Strawn LLP (57) ABSTRACT

The invention relates to a process of treating a structure for electronics or optoelectronics, wherein the structure that has a substrate, a dielectric layer having a thermal conductivity substantially higher than thermal conductivity of an oxide layer made of an oxide of a semiconductor material, an oxide layer made of an oxide of the semiconductor material, and a thin semiconductor layer made of the semiconductor material. The process includes a heat treatment of the structure in an inert or reducing atmosphere with a temperature and a duration chosen for inciting an amount of oxygen of the second oxide layer to diffuse through the semiconductor layer so that the thickness of the second oxide layer decreases by a determined value. The invention also relates to a process of manufacturing a structure for electronics or optoelectronics applications through the use of this type of heat treatment.

19 Claims, 3 Drawing Sheets

FOREIGN PATENT DOCUMENTS

WO    WO 94/15359    7/1994

OTHER PUBLICATIONS

K.-Y. Ahn et al., "Stability Of Interfacial Oxide Layers During Silicon Wafer Bonding", Journal of Appl. Phys., vol. 65, No. 2, pp. 561-563 (1989).

Oleg Kononchuk et al., "Internal Dissolution of Buried Oxide in SOI Wafers", Solid State Phenomena, vol. 131-133, pp. 113-118 (2008).

Jim Sullivan et al., "High Temperature Oxygen Out-Diffusion from the Interfacial SiOx Bond Layer in Direct Silicon Bonded (DSB) Substrates", IEEE 2006 International SOI Conference.

A. Misiuk et al., "Effect Of High Temperature—Pressure On SOI Structure", Crystal Engineering, vol. 5, pp. 155-161 (2002).

Zengfeng Di et al., "Fabrication Of Silicon-On-$SiO_2$/Diamondlike-Carbon Dual Insulator Using Ion Cutting And Mitigation Of Self-Heating Effects", Applied Physics Letters, vol. 88, pp. 142108-1-142108-3 (2006).

\* cited by examiner

METHOD FOR PRODUCING A SEMICONDUCTOR-ON-INSULATOR STRUCTURE

CROSS-REFERENCE TO RELATED APPLICATIONS

This application is a continuation of International application no. PCT/IB2006/003957 filed Dec. 26, 2006, the entire content of which is expressly incorporated herein by reference thereto.

BACKGROUND

The invention relates to the manufacturing of Semiconductor-On-Insulator (SeOI) structures for electronics or optoelectronics applications, and in particular Silicon-On-Insulator or SOI structures having a high thermal conductivity.

A SeOI structure comprises a substrate, a dielectric layer and a top semiconductor layer, the dielectric layer electrically insulating the top layer from the substrate. SeOI structures are usually manufactured by wafer bonding via the dielectric layer which acts both as an electric insulator and as a bonding layer between the top layer and the substrate.

The SeOI structures that are highly thermal conductor are especially used for dissipating the heat released from components to be manufactured in the top layer of the SeOI. It is particularly useful for components able to release a large quantity of heat, like high power frequency components.

To this end, it is known to provide a substrate with material(s) having good thermal conductivity, like monocrystalline or polycrystalline SiC.

For these kinds of structures, it would be also appreciated having a dielectric layer that is a good conductor of thermal energy. For this purpose, it is known to provide a dielectric nitride layer, like $Si_3N_4$ or $Si_xN_yO_z$ between the substrate and the top layer. However, the manufacturing of these SeOI structures by wafer bonding is difficult due to the fact that nitride materials have bad bonding properties. $SiO_2$ has better bonding properties, but it has a low thermal conductivity.

Accordingly, there is a need for manufacturing SeOI structures with high thermal conductivity while implementing a bonding of good quality.

SUMMARY OF THE INVENTION

The present invention now satisfies the prior art need for such SeOI structures. In particular, the invention relates to a process for treating a structure for use in electronics or optoelectronics applications, which comprises heat treating a structure comprising, successively, a substrate, a dielectric layer having a thermal conductivity substantially higher than that of an oxide layer made of an oxide of a semiconductor material, an oxide layer made of an oxide of a semiconductor material, and a semiconductor layer made of a semiconductor material, in an inert or reducing atmosphere at a temperature and a time sufficient to diffuse an amount of oxygen of the oxide layer through the semiconductor layer so that the thickness of the second oxide layer decreases by a predetermined amount. Advantageously, the thickness of the semiconductor layer is between around 250 angstroms and around 5000 angstroms, the temperature is about 1200° C. and the time is between around 5 minutes and 5 hours.

The oxide layer can have a thickness between around 100 angstroms and around 500 angstroms. The heat treatment can be applied so that substantially the whole oxide layer is removed or so that a part of the oxide layer remains. The dielectric layer has a thickness sufficient for electrically insulating the semiconductor layer from the substrate, considering the components to be manufactured in the semiconductor layer.

In this process, the dielectric layer can have a thermal conductivity that is higher than 10 $W.cm^{-1}.K^{-1}$ and a thickness in the range of 1,000 to 5,000 Å. The preferred materials for the dielectric layer include nitride, diamond, alumina ($Al_2O_3$), aluminum nitride (AlN), sapphire, or preferably $Si_3N_4$. The substrate can also be made of a material having high thermal conductivity.

Another embodiment of the invention relates to a process of manufacturing a structure for use in electronics or optoelectronics applications, which comprises providing a semiconductor layer made of a semiconductor material and having a predetermined thickness; providing a receiving wafer that successively includes a substrate, a top dielectric layer made of a dielectric material having a thermal conductivity that is higher than that of an oxide layer made of an oxide of the semiconductor material; forming a bonding interface that includes as a bonding layer an oxide of the same semiconductor material as that of the semiconductor layer; bonding the semiconductor layer to the receiving wafer at the bonding interface such that the dielectric layer is sandwiched between the semiconductor layer and the substrate, thus forming a structure comprising successively the substrate, the dielectric layer, the oxide layer and the thin semiconductor layer; and heat treating the structure in an inert or reducing atmosphere at a temperature and a time sufficient to diffuse an amount of oxygen of the oxide layer through the semiconductor layer so that the thickness of the oxide layer decreases by a predetermined amount.

In this process, the oxide layer may be formed on the dielectric layer, on the semiconductor layer, or on both the dielectric layer and the semiconductor layer. In a preferred arrangement, the semiconductor layer is provided as part of a donor substrate and which further comprises reducing the thickness of the donor substrate so that only the semiconductor layer is bonded to the receiving substrate. The thickness of the donor wafer can be reduced by implanting atomic species in the donor substrate to form a zone of weakness beneath the semiconductor layer, and supplying energy for detaching the semiconductor layer from the donor structure at the zone of weakness.

The heat treating temperature can be firstly chosen according to a determined profile, and then the predetermined thickness is chosen for determining the duration or the duration is chosen for determining the predetermined thickness, these choices being made for reducing the thickness of the first oxide layer by a predetermined value. A temperature of between 1,100° C. and 1,250° C. is suitable. Also, the predetermined thickness and temperature are chosen for having a mean reduction rate of the first oxide layer of at least about 0.5 angstroms per minute. When the thickness of the semiconductor layer is between around 250 angstroms and around 5,000 angstroms, the heat treating temperature can be about 1,200° C. and the treatment time between around 5 minutes and 5 h Accordingly, it is possible to manufacture a SeOI with a dielectric layer that has a very good thermal conductivity while ensuring a bonding of good quality, i.e. a bonding similar to the bonding via an oxide layer. Indeed, once the oxide layer was used for ensuring a bonding of good quality between the semiconductor layer and the substrate, it is dissolved during the heat treatment (step (d)), for leaving the dielectric layer as the sole dielectric layer of the SeOI.

BRIEF DESCRIPTION OF THE DRAWING FIGURES

Other features and advantages of the invention will appear in the detailed description that follows and which is illustrated by the drawing figures, wherein.

DETAILED DESCRIPTION OF THE PREFERRED EMBODIMENTS

Figure 1:
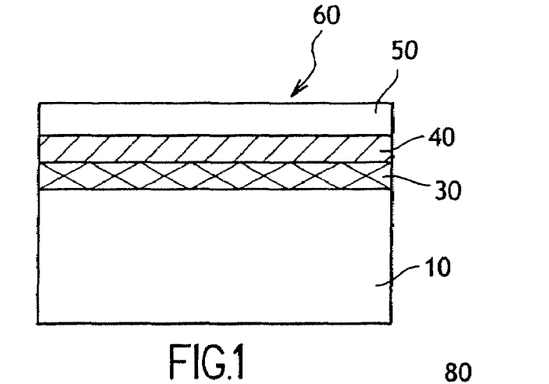
FIG. 1 shows a schematic cross-section view of structure according to the invention.

Referring to FIG. 1, a structure 60 from which the treatment according to the invention will be processed, is shown. This structure 60 comprises a substrate 10, a dielectric layer 30, an oxide layer 40, and a thin semiconductor layer 50. The dielectric layer 30 is made of a material having a higher thermal conductivity than that of an oxide layer made of an oxide of the semiconductor material. This dielectric layer 30 may preferably be made of a nitride material or of diamond, alumina ($Al_2O_3$), aluminum nitride (AlN), sapphire.

This structure 60 is aimed to be heat treated for dissolving the oxide layer 40, and obtaining then a SeOI structure comprising the substrate 10, the dielectric layer 30 and a semiconductor layer 50'. Preferably, the semiconductor layer 50' comprises the de-oxidized oxide layer 40 and the thin semiconductor layer 50 (see FIG. 2E). Alternatively, the SeOI structure comprises the substrate 10, the dielectric layer 30 and a semiconductor layer 50' which comprises a very thin oxide layer coming from the partial dissolution of the oxide layer 40, and the thin semiconductor layer 50.

The substrate 10 stiffens the whole structure 60. To this aim, it has a sufficient thickness, typically of hundreds of micrometers. The substrate 10 may be formed of a single bulk material, like Si, Ge, SiC, GaN, sapphire, glass, quartz, or other materials. Preferably, the substrate 10 is made of a material having good thermal conductivity, like monocrystalline or polycrystalline SiC. Alternatively, the substrate 10 is a composite structure formed of at least two materials, stacked one onto the other.

The semiconductor layer 50 is made of at least one semiconductor material. The semiconductor layer 50 may be of Si, SiC, Ge, SiGe, SiGeC, a Group III-V material, a Group II-VI material or another semiconductor material. The semiconductor layer 50 may alternatively be a combination of or a superposition of at least two of these materials and/or a superposition of several sub-layers.

The semiconductor material may be monocrystalline, polycrystalline or amorphous. It may be doped or non-doped, porous or non-porous. The semiconductor layer 50 is advantageously formed for receiving electronic or optoelectronic components.

According to the invention, the semiconductor layer 50 is advantageously thin. Its thickness is advantageously less than about 5,000 angstroms, and in particular less than 2,500 angstroms. For example, the semiconductor layer 50 may have a thickness between around 250 angstroms and 2,500 angstroms, or between around 250 angstroms and 1,200 angstroms. Especially, the thickness of the semiconductor layer 50 may be chosen between 500 and 1,000 angstroms, for accelerating oxygen diffusion.

The oxide layer 40 is buried in the structure 60, located between the dielectric layer 30 and the semiconductor layer 50. The oxide layer 40 is made of an oxide of the semiconductor material. If the semiconductor layer 50 is constituted of several semiconductor sub-layers, the oxide layer 40 can be made of an oxide of the semiconductor material of the adjacent sub-layer. For example, if the semiconductor layer 50 is of Si, the oxide layer 40 is of $SiO_2$.

This oxide layer 40 is configured for having adhesive properties. It is to be noticed that this oxide layer 40 is not configured for having electrical insulating properties in order to electrically insulate the electronic or optoelectronic components to be formed in the semiconductor layer 50 from the substrate 10. The oxide layer 40 may be thin.

Its thickness may be chosen less than 500 angstroms or less than this thickness. For example, this thickness may be between around 100 angstroms and around 500 angstroms or between around 200 angstroms and around 500 angstroms. A thickness of between 350 and 500 angstroms may be considered as optimum if the semiconductor layer 50 was initially transferred by bonding (via the oxide layer 40) by the SMART CUT® technology, and if a heat treatment is further implemented for densifying the oxide layer 40. Indeed, this thickness may be chosen for both ensuring a SMART CUT® technology of good quality (i.e. so as to capture water at the interface) and for allowing a dissolution of the oxide layer 40 in a relatively short time.

The dielectric layer 30 is buried in the structure 60, located between the substrate 10 and the oxide layer 40. The dielectric layer 30 is typically made of a dielectric material having a high thermal conductivity, like a nitride of the semiconductor material, like $Si_3N_4$, $Si_xO_yN_z$, diamond, alumina ($Al_2O_3$), aluminum nitride (AlN), or sapphire.

A dielectric layer 30 is considered to have high thermal conductivity when its thermal conductivity is higher than that of the oxide layer 40, or, more particularly, when its thermal conductivity is greater than 10 $W.cm^{-1}.K^{-1}$ at room temperature. This dielectric layer 30 may be thin, or it can be configured for having electrical insulating properties in order to at least partly electrically insulate the electronic or optoelectronic components to be formed in the semiconductor layer 50 from the substrate 10. The dielectric layer 30 is not specifically configured for providing adhesive properties.

Additionally, the dielectric layer 30 is configured for conducting a determined amount of heat. If the dielectric layer 30 is made of a nitride material (like $Si_3N_4$), diamond, alumina ($Al_2O_3$), aluminum nitride (AlN), sapphire, its thickness may be similar to or lower than 5,000 angstroms, and may be in the range of 1,000 to 5,000 angstroms. Also, this thickness may be between around 100 angstroms and around 1,000 angstroms or between around 200 angstroms and around 500 angstroms. Its thickness may also be of a few angstroms. Moreover, this dielectric layer 30 is preferably formed for having a uniform thickness. The obtained uniformity value may be of +/−3% or lower.

The manufacturing of this structure 60 may be accomplished by a wafer bonding technique, as illustrated on FIGS. 2A to 2E, between a first wafer 70 and a second wafer 80. Especially, with reference to FIG. 2A, the manufacturing can be firstly implemented by providing a first wafer 70 with the substrate 10 and the dielectric layer 30, the dielectric layer 30 being a top layer. In a preferred embodiment, the dielectric layer 30 is formed on the substrate 10. The purpose of this dielectric formation is to provide a buried dielectric layer with a predetermined thickness for forming, after bonding, the insulator part of a SeOI structure highly conductive of thermal energy, the insulator part of this structure being the dielectric layer 30.

Figure 2A:
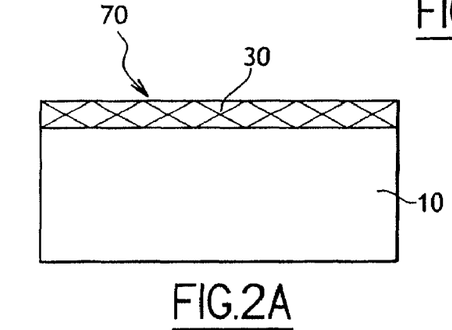
FIGS. 2A to 2E show the different steps of a process of manufacturing the structure.

The dielectric layer 30 may be a nitride layer formed by nitridation of the top of the substrate 10. For example, if the substrate 10 has a superficial layer made of Si or SiGe, a $Si_3N_4$ layer 20 may be formed at the surface by nitridation. Alternatively, the dielectric layer 30 may be formed by deposition (e.g. CVD) of aggregates made of the dielectric material. For example, $Si_3N_4$ or Diamond aggregates may be deposed.

The parameters of the dielectric formation (like temperature, gas flows) are controlled such that the dielectric layer 30 is a dielectric barrier between the components to manufacture in the semiconductor layer 50 and the substrate 10. Particularly, the material, the thickness, and eventually the intrinsic structure, of it are chosen to this end. It is to be noticed that this dielectric layer 30 is not aimed to be a bonding layer, like in the prior art. Accordingly, no defaults are trapped at a bonding interface, and its quality is better.

Additionally, the dielectric formation parameters can be chosen for improving the interface with the substrate 10, lowering the defaults at the interface, and for having a good thickness homogeneity. The thickness of the dielectric layer 30 may then be lower than a standard thickness of a bonding layer.

Advantageously according to the invention, the dielectric layer 30 is thin. For example, the dielectric layer 30 has a thickness, after bonding, between around 1,000 and 5,000 angstroms, or between around 200 angstroms and around 500 angstroms, or between 350 and 500 angstroms. Of course, the dielectric layer 30 has also to be sufficiently thick for conducting the determined amount of thermal energy.

Figure 2B:
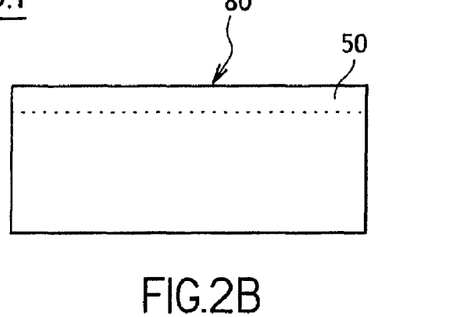

With reference to FIG. 2B, a second step consists of providing the second wafer 80 with the semiconductor layer 50 within, the semiconductor layer 50 lying at the surface of the second wafer 80 defining a front layer. The second wafer 80 may be of a single bulk material, the semiconductor layer 50 being then in the bulk material or grown on it.

Alternatively, the second wafer 80 may be a composite wafer comprising a holder substrate and a multilayer structure (not shown). In particular, the second wafer 80 can include a buffer structure between the holder substrate and the semiconductor layer 50 arranged for adapting the lattice parameter between these two elements and/or for confining defaults. For example, the second wafer 80 comprises a Si holder substrate, a SiGe buffer layer with a Ge concentration continuously increasing in thickness from the holder, and a SiGe or Ge and/or a strained Si semiconductor layer 50 over it. Some Carbon can be added in these materials.

Advantageously, the semiconductor layer 50 has been epitaxially grown. Crystalline growth of the epitaxial layer may have been obtained using the known techniques of LPD (or more specifically LPCVD), CVD and MBE (respectively Liquid Phase Deposition, Chemical Vapor Deposition, and Molecular Beam Epitaxy).

Figure 2C:
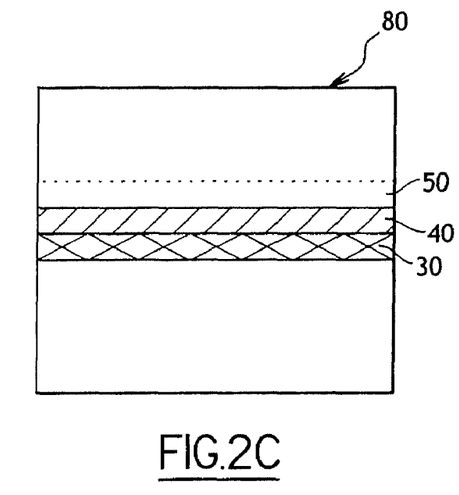

With reference to FIG. 2C, a third step consists of bonding the first wafer 70 to the second wafer 80 such that the semiconductor layer 50 faces the dielectric layer 30. Advantageously, the bonding is firstly implemented by well-known bonding techniques (see, for example, "Semiconductor Wafer Bonding Science and Technology" by Q.-Y. Tong and U. Gösele—a Wiley Interscience publication, Johnson Wiley & Sons, Inc—for more details). Thus, for example, molecular bonding of hydrophilic surfaces or surfaces rendered hydrophilic may be done.

Well-known cleaning steps may be implemented just before bonding. Optionally, a plasma treatment of one and/or the other of the two surfaces to be bonded, followed by conventional annealing or RTA treatment (rapid thermal annealing), is implemented.

With reference to FIG. 2C, the oxide layer 40 was formed, before bonding, on the semiconductor layer 50 and/or on the dielectric layer 30, for being buried at the bonding interface after bonding. This oxide layer 40 is formed by specific means on the semiconductor layer 50 and/or on the dielectric layer 30. The oxide layer 40 may be formed by oxidation of the top part of the semiconductor layer 50. For example, if the semiconductor layer 50 is of Si or SiGe, $SiO_2$ layer 40 may be formed at the surface by oxidation.

Alternatively, the oxide layer 40 may be formed by deposition of aggregates constituted of the oxide material on the semiconductor layer 50 and/or on the dielectric layer 30. For example, $SiO_2$ aggregates may be deposited.

The parameters of the formation of the oxide are controlled such that the oxide layer 40 is a bonding layer sufficiently thick for ensuring a sufficient adhesivity between the first and second wafers 70-80. Especially, if a SMART CUT® technology is planned to be processed in the first wafer 70, the oxide layer 40 has to be sufficiently thick for avoiding problems associated with water and particles captured at the bonding interface that can generate some interfacial defaults and/or bubbles in the semiconductor layer 50 during a subsequent heat treatment.

On the other hand, it is preferable that this thickness is not too high for avoiding that the dissolution heat treatment lasts too much time. The oxide layer 40 may have a thickness below 600 angstroms, or below 500 angstroms, or between 200 and 500 angstroms. The preferred thickness is between 350 and 500 angstroms as previously explained.

With reference to FIG. 2C, the second wafer 80 and the first wafer 70 are bonded together such that the oxide layer 40 is located at the interface, as previously explained. Optionally, at least one step of heating is additionally implemented for reinforcing the bonds at the interface.

Figure 2D:
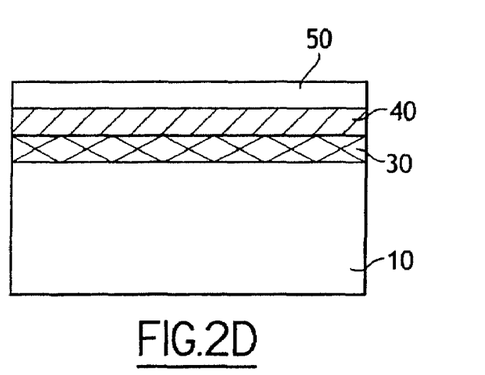

Referring to FIG. 2D, the structure 60 is obtained by reducing the second wafer 80 such that a rear portion is removed. Only the semiconductor layer 50 is kept. Any technique of wafer reduction may be used, such as chemical etching technique, lapping then polishing, SMART CUT® technology which is known per se to the skilled person (see, for example, G. Celler, Frontiers of Silicon-on-Insulator, Journal of Applied Physics, Vol. 93, no. 9, May 1, 2003, pages 4955-4978).

In particular, if using the SMART CUT® technology, the second wafer 80 is implanted prior to bonding, with atomic species (such as hydrogen, helium or a combination of them, and/or other atomic species) at energy and dose selected for producing within a zone of weakness at a depth close to the thickness of the semiconductor layer 50. The implantation may be carried out before or after forming the oxide layer 40. Finally, once the bonding has been carried out, SMART CUT® technology comprises supplying suitable energy (such as thermal and/or mechanical energy) for rupturing the zone of weakness, thus detaching the rear portion 60 from the semiconductor layer 50.

An optional step of finishing (e.g., by polishing, CMP, cleaning, . . . ) may be implemented after the reduction step, in order to have a smooth and homogeneous semiconductor layer 50. This finishing step may be implemented prior to or after the heat treatment described herein. Other steps may also be provided, with no limitation according to the invention. The obtained structure 60 comprises successively the substrate 10, the dielectric layer 30, the oxide layer 40, and the thin semiconductor layer 50.

Figure 2E:
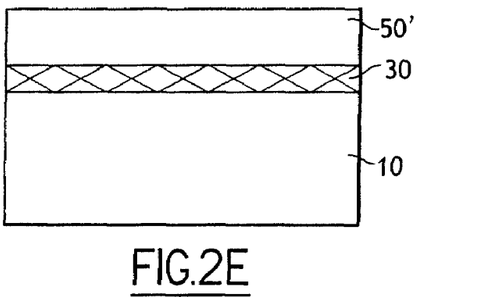

A heat treatment according to the invention is then processed for reducing or removing the thickness of the oxide layer 40. The heat treatment is implemented in an inert or reducing atmosphere, such as argon, hydrogen or a mixture of them. With reference to FIG. 2E, the heat treatment is processed such that the oxide layer 40 reduces in thickness or is entirely dissolved, by oxygen diffusion through the semiconductor layer 50.

The final structure 100 is a SeOI structure, with an insulator part formed by the dielectric layer 30 and eventually by a thin remaining part of the oxide layer 40. The semiconductor part 50' of the SeOI structure 100 is the semiconductor layer 50 and the de-oxidized part of the oxide layer 40. During the heat treatment, it is to be noticed that a part of the semiconductor layer 50 may have been evaporated away by the inert gas treatment.

Figure 3:
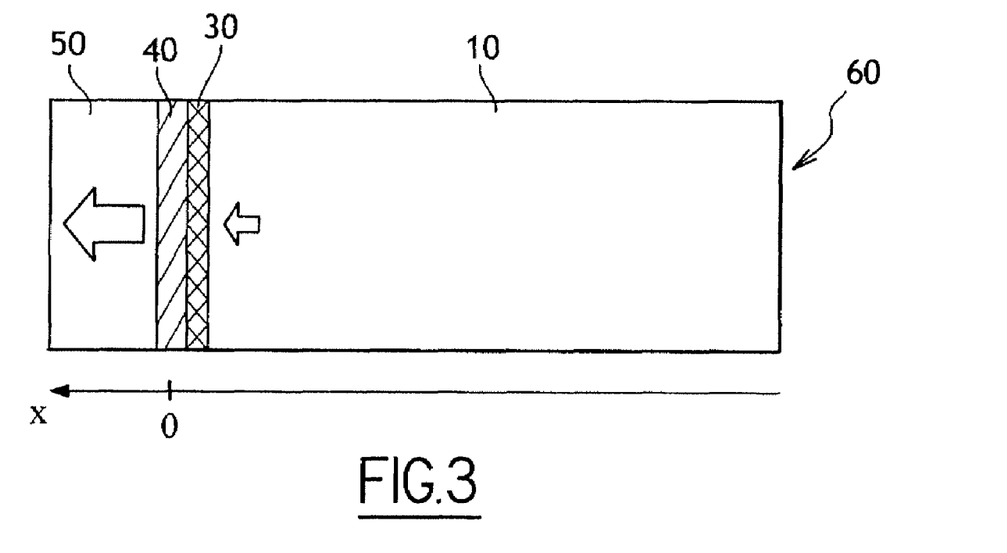
FIGS. 3 and 4 are schematic cross-section views of the structure, illustrating the diffusion phenomena.
Figure 4:
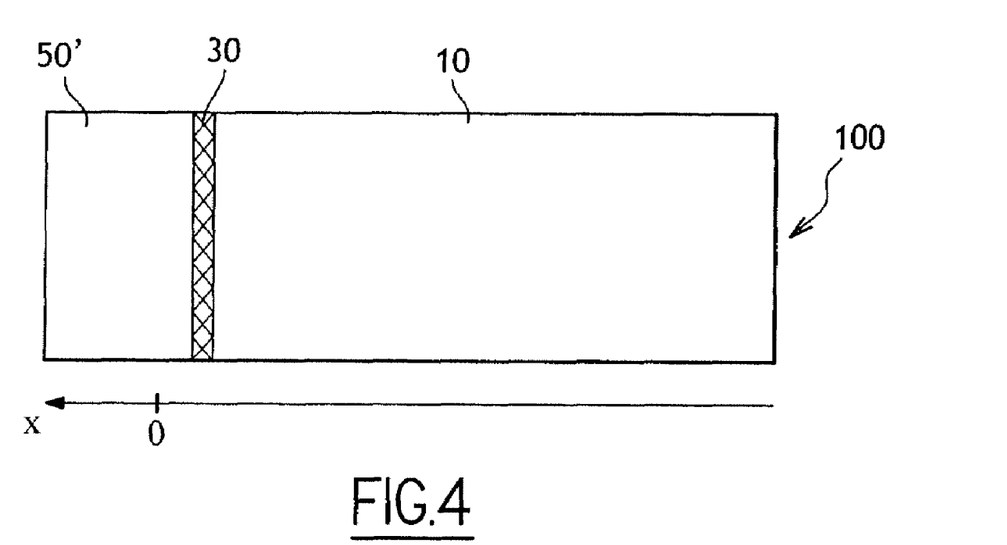

For illustrating the reduction of the oxide layer 40 due to oxygen diffusion, FIGS. 3 and 4 show respectively a cross sectional view of the structure 60, one during diffusion and the other after diffusion. The structure 60 contains two diffusion domains:

left side (top semiconductor layer 50) and
right side (substrate 10—dielectric layer 30);
separated by the oxide layer 40 with a thickness $d_{ox}$.

It is assumed that the diffusion of oxygen is in one dimension—the diffusion equation is then:

$$\frac{\partial C(x, t)}{\partial t} = D(T)\frac{\partial^2 C(x, t)}{\partial x^2}$$

wherein: the x-axis extends transversally to the layer planes, has its origin at the center of the oxide layer 40, and is pointed to the positive value in the semiconductor layer 50, and to the negative value in the bulk substrate 10.

$C(x, t)$ is the oxygen concentration at time t and at x.

$D(T)$ is the diffusion coefficient of the oxygen in the semiconductor (unit: cm$^2$/s).

Figure 5:
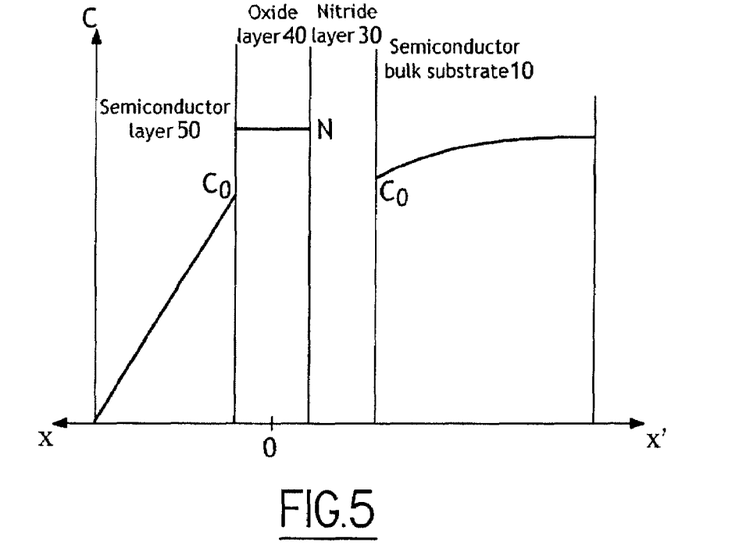
FIG. 5 is a graph showing distribution of oxygen inside the structure after a heat treatment according to the invention.
Figure 6:
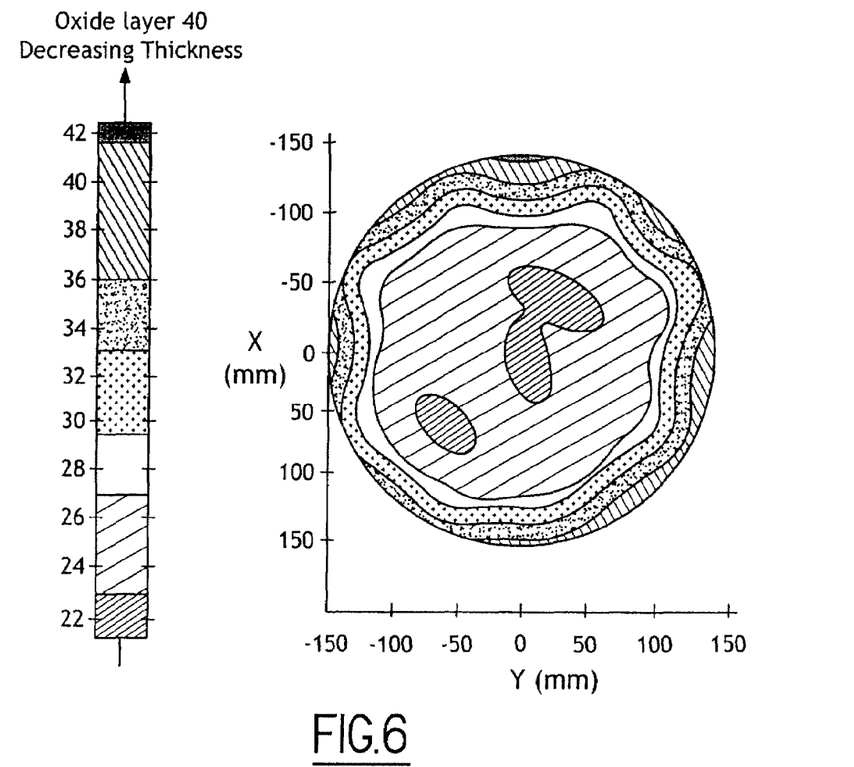
FIG. 6 shows difference of the BOX thickness of a heat-treated BOX in a SOI wafer after a heat treatment according to the invention, along the whole area of the BOX, measured by ellipsometry.

FIG. 5 schematically shows distribution of oxygen in the structure during a heat treatment. If the top semiconductor layer 50 is sufficiently thin, some oxygen of the oxide layer 40 diffuses through it and evaporates in the atmosphere at the surface of it. This diffusion is accelerated by the fact that the atmosphere is chosen inert, as it can be deduced from the boundary conditions.

In particular, the following reaction occurs at the surface of the semiconductor layer 50 if the inert atmosphere contains hydrogen and the layer is in silicon:

$SiO_2 + H_2 \rightarrow H_2O + SiO\uparrow$ if atmosphere is $H_2$ $SiO_2 + Si \rightarrow 2SiO\uparrow$ if atmosphere is Ar For increasing the efficiency of this diffusion, a previous deoxidation of the surface of the semiconductor layer 50 may be done.

The dielectric layer 30 prevents from the diffusion through the substrate 10. Then, after a determined time and if the thickness of the semiconductor layer 50 is small with respect to the oxygen diffusion length $(D*t)^{1/2}$, it has been calculated that the diffusion time is acceptable. In this last case, the determined time is about 100 s, at about 1,200° C.

In such conditions the steady flux is defined as:

$F = D(T)*C_0(T)/d_{se}$ where: $d_{se}$ is the thickness of the semiconductor layer 50
where $C_0(T)$ is the equilibrium oxygen solubility in the semiconductor at annealing temperature.

Oxide dissolution time for decreasing the oxide layer 40 thickness $d_{ox}$ by a predetermined value $\Delta d_{ox}$, is:

$$\text{time} = \frac{d_{Se}*\Delta d_{ox}}{D(T)*C(T)}*N$$

where: N is the concentration of oxygen atoms in oxide.

For example, if the semiconductor layer 50 is of monocrystalline Si then N=4.22e22, and the oxide layer 40 is of $SiO_2$, and if $d_{se}$=1000 angstroms and $\Delta d_{ox}$=20 angstroms: time=1.86e−12*exp(4.04 eV/kT). It has been found that the main parameter affecting the time is the anneal temperature and the thickness of the top semiconductor layer 50.

For example, and based on numerical simulation, the minimum annealing conditions to dissolve 20 angstroms of interfacial $SiO_2$, with 1000 angstroms of top Si layer, in a Ar or $H_2$ atmosphere, are:

1,100° C. for 2 hr, or
1,200° C. for 10 min, or
1,250° C. for 4 min.

The temperature and the duration of the heat treatment are then chosen for inciting an amount of oxygen of the oxide layer 40 to diffuse through the semiconductor layer 50. Then, the thickness of the oxide layer 40 decreases by a predetermined value.

Additionally, the thickness of the semiconductor layer 50 may also have been chosen, when forming it, for inciting the diffusion. Particularly, the thickness of the semiconductor layer 50 and the temperature of the heat treatment determine the mean reduction rate of the oxide layer 40. The greater the thickness, the less the rate: the greater the temperature, the greater the rate. For example, the thickness and temperature may be predetermined such that at least about 0.5 angstroms per minute of oxide layer 40 mean reduction rate is reached. To this purpose, for a temperature of about 1,200° C., a thickness of a (110) Si monocrystalline layer 10 is chosen less than 2,500 angstroms.

Only the duration of the heat treatment is then necessary to control for accurately reducing the thickness of the oxide layer 10 by a predetermined value. Alternatively, the thickness of the semiconductor layer 50 has been chosen for reducing the oxide layer 40 by a predetermined value by implementing the heat treatment with a predetermined duration and a predetermined temperature. The predetermined temperature may be chosen about 1,000° C. to 1,300° C., and especially around 1,100° C. to 1,200° C. The thickness of the semiconductor layer 50 may be between around 250 angstroms and around 1,000 angstroms, the predetermined temperature is about 1,200° C. and the predetermined duration is between around 5 minutes and 5 hours.

The heat treatment is processed for reducing the oxide layer 40 by a predetermined thickness. By adjusting precisely the parameters of the heat treatment, it is then possible to control precisely the reduction of material in the oxide layer 40, for finally having an oxide layer 40 with a desired thickness. According to the invention, it is then possible to control precisely the thickness of the oxide layer 40 of SeOI. Particularly, it is possible to remove the whole oxide layer 40. Alternatively, it is possible to leave a thin oxide layer (of about 10-100 angstroms) in order to improve the electrical properties at the interface (i.e. to decrease the Dit).

Additionally, the bonding between the semiconductor layer 50 and the substrate 10 can be done with an oxide layer 40 having a thickness greater than a limit thickness beyond which the deformation of the semiconductor layer 50 and bubbles are avoided. Furthermore, as risks of deterioration of the semiconductor layer 50 are decreased, the thickness of the latter can also be decreased, while still respecting manufacturing specifications. Thus, the components to be manufactured in the semiconductor layer 50 may be more miniaturized and have lower power consumption than the prior art.

A main advantage of the invention is that the dielectric layer 30 is maintained in its initial configuration, even if the diffusing heat treatment is implemented. Indeed, the dielectric layer 30 is not used for the bonding, and its initial dielectric and thermal properties can thus be maintained. The dielectric properties of the dielectric layer 30 can then be initially calibrated very precisely, without taking account of the next heat treatment.

What is claimed is:

1. A process of treating a structure for use in electronics or optoelectronics applications, which comprises heat treating a structure comprising, successively, a substrate, a dielectric layer having a thermal conductivity substantially higher than that of an oxide layer made of an oxide of a semiconductor material, an oxide layer made of an oxide of a semiconductor material, and a semiconductor layer made of a semiconductor material and having a thickness of between around 250 angstroms and around 5000 angstroms, the heat treating conducted in an inert or reducing atmosphere at a temperature and a time sufficient to diffuse an amount of oxygen of the oxide layer through the semiconductor layer so that the thickness of the oxide layer decreases by a predetermined amount, wherein a part of the oxide layer is left after the heat treatment.

2. The process of claim 1, wherein the temperature is about 1200° C. and the time is between around 5 minutes and 5 hours.

3. The process of claim 1, wherein the oxide layer has a thickness between around 100 angstroms and around 500 angstroms.

4. The process of claim 1, wherein the dielectric layer has a thickness sufficient for electrically insulating the semiconductor layer from the substrate, considering the components to be manufactured in the semiconductor layer.

5. The process of claim 1, wherein the dielectric layer has a thermal conductivity that is higher than 10 W.cm$^{-1}$.K$^{-1}$.

6. The process of claim 1, wherein the dielectric layer has a thickness in the range of 1,000 to 5,000 Å.

7. The process of claim 6, wherein the dielectric layer is made of nitride, diamond, alumina ($Al_2O_3$), aluminum nitride (AlN), or sapphire.

8. The process of claim 6, wherein the dielectric layer comprises $Si_3N_4$.

9. The process of claim 1, wherein the substrate is made of a material having high thermal conductivity.

10. A process of manufacturing a structure for use in electronics or optoelectronics applications, which comprises:
   providing a semiconductor layer made of a semiconductor material and having a predetermined thickness;
   providing a receiving wafer that successively includes a substrate, a top dielectric layer made of a dielectric material having a thermal conductivity that is higher than that of an oxide layer made of an oxide of the semiconductor material;
   forming a bonding interface that includes as a bonding layer an oxide of the same semiconductor material as that of the semiconductor layer, wherein the oxide layer is formed on the dielectric layer or on both the semiconductor layer and the dielectric layer;
   bonding the semiconductor layer to the receiving wafer at the bonding interface such that the dielectric layer is sandwiched between the semiconductor layer and the substrate, thus forming a structure comprising successively the substrate, the dielectric layer, the oxide layer and the thin semiconductor layer; and
   heat treating the structure in an inert or reducing atmosphere at a temperature and a time sufficient to diffuse an amount of oxygen of the oxide layer through the semiconductor layer so that the thickness of the oxide layer decreases by a predetermined amount.

11. The process of claim 10, wherein the oxide layer is formed on the dielectric layer.

12. The process of claim 10, wherein the oxide layer is provided on both the dielectric layer and the semiconductor layer.

13. A process of manufacturing a structure for use in electronics or optoelectronics applications, which comprises:
   providing a semiconductor layer made of a semiconductor material and having a predetermined thickness;
   providing a receiving wafer that successively includes a substrate, a top dielectric layer made of a dielectric material having a thermal conductivity that is higher than that of an oxide layer made of an oxide of the semiconductor material;
   forming a bonding interface that includes as a bonding layer an oxide of the same semiconductor material as that of the semiconductor layer;
   bonding the semiconductor layer to the receiving wafer at the bonding interface such that the dielectric layer is sandwiched between the semiconductor layer and the substrate, thus forming a structure comprising successively the substrate, the dielectric layer, the oxide layer and the thin semiconductor layer; and
   heat treating the structure in an inert or reducing atmosphere at a temperature and a time sufficient to diffuse an amount of oxygen of the oxide layer through the semiconductor layer so that the thickness of the oxide layer decreases by a predetermined amount,
   wherein the semiconductor layer is provided as part of a donor substrate and which further comprises reducing the thickness of the donor substrate so that only the semiconductor layer is bonded to the receiving substrate.

14. The process of claim 13, wherein the thickness of the donor wafer is reduced by implanting atomic species in the donor substrate to form a zone of weakness beneath the semiconductor layer, and supplying energy for detaching the semiconductor layer from the donor structure at the zone of weakness.

15. The process of claim 10, wherein the heat treating temperature is firstly chosen according to a determined profile, and then the predetermined thickness is chosen for determining the duration or the duration is chosen for determining the predetermined thickness, these choices being made for reducing the thickness of the first oxide layer by a predetermined value.

16. The process of claim 15, wherein the temperature is between 1,100° C. and 1,250° C.

17. The process of claim 15, wherein the predetermined thickness and temperature are chosen for having a mean reduction rate of the first oxide layer of at least about 0.5 angstroms per minute.

18. The process of claim 10, wherein the thickness of the semiconductor layer is between around 250 angstroms and around 5,000 angstroms, the heat treating temperature is about 1,200° C. and the treatment time is between around 5 minutes and 5 hours.

19. The process of claim 13, wherein the thickness of the semiconductor layer is between around 250 angstroms and around 5,000 angstroms, the heat treating temperature is about 1,200° C. and the treatment time is between around 5 minutes and 5 hours.

* * * * *